(12) United States Patent
Nohara et al.

(10) Patent No.: US 6,680,683 B2
(45) Date of Patent: Jan. 20, 2004

(54) WAVEFORM SHAPING CIRCUIT

(75) Inventors: Manabu Nohara, Tokyo (JP); Tomoaki Iwai, Tokyo (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/252,403

(22) Filed: Sep. 24, 2002

(65) Prior Publication Data

US 2003/0067406 A1 Apr. 10, 2003

(30) Foreign Application Priority Data

Oct. 4, 2001 (JP) ........................................ 2001-308869

(51) Int. Cl.[7] ................................................. H03M 1/12
(52) U.S. Cl. ......................................... 341/155; 341/156
(58) Field of Search ................................. 341/155, 143, 341/156

(56) References Cited

U.S. PATENT DOCUMENTS

| | | | |
|---|---|---|---|
| 4,796,004 A | * 1/1989 | Rich et al. .................. | 341/143 |
| 5,005,184 A |   4/1991 | Amano et al. ............... | 375/14 |
| 5,298,900 A | * 3/1994 | Mauthe et al. .............. | 341/143 |
| 5,682,160 A | * 10/1997 | Ribner et al. ............... | 341/143 |
| 5,757,301 A | * 5/1998 | Kuo et al. ................... | 341/143 |
| 5,905,453 A | * 5/1999 | Kase .......................... | 341/143 |
| 6,067,329 A |   5/2000 | Kato et al. .................. | 375/321 |
| 6,138,132 A |   10/2000 | Lee et al. .................... | 708/313 |
| 6,154,161 A | * 11/2000 | Leme et al. ................. | 341/143 |
| 6,208,279 B1 | * 3/2001 | Oprescu ..................... | 341/143 |
| 6,232,900 B1 | * 5/2001 | Hendricks et al. .......... | 341/143 |
| 6,489,913 B1 | * 12/2002 | Hansen et al. .............. | 341/156 |

* cited by examiner

*Primary Examiner*—Jean Jeanglaude
(74) *Attorney, Agent, or Firm*—Morgan, Lewis & Bockius LLP

(57) ABSTRACT

A small sized digital Nyquist filter having a high processing speed is provided. A delay in a delay element in the digital Nyquist filter is synchronized with a symbol rate of an input signal, and filtering coefficients at respective taps in the filer are sequentially selected synchronously with a sampling clock in accordance with a predetermined procedure, thereby reducing the number of taps to 1/oversampling number.

3 Claims, 6 Drawing Sheets

INPUT SIGNAL Sj

OUTPUT SIGNAL Xn

FIG. 4

| C1 COEFFICIENT ROM ||
|---|---|
| ADDRESS (Qb, Qa) | STORAGE DATA (FILTERING COEFFICIENT) |
| 0, 0 | $C_{1,0}$ |
| 0, 1 | $C_{1,1}$ |
| 1, 0 | $C_{1,2}$ |

| C2 COEFFICIENT ROM ||
|---|---|
| ADDRESS (Qb, Qa) | STORAGE DATA (FILTERING COEFFICIENT) |
| 0, 0 | $C_{2,0}$ |
| 0, 1 | $C_{2,1}$ |
| 1, 0 | $C_{2,2}$ |

WAVEFORM SHAPING CIRCUIT

BACKGROUND OF THE INVENTION

1. Field of the Invention

The invention relates to a waveform shaping circuit which is used in a code transmitting apparatus.

2. Description of the Related Art

An important component element in a digital code transmitting apparatus is a waveform shaping circuit (hereinafter, referred to as a "Nyquist filter") for data transmission. In the shaping circuit, in a frequency domain of a signal, an attenuation in a stop band is set to an equal ripple, and in a time domain of a signal, an inter-symbol interference is approximated to "0".

A construction of a conventional digital Nyquist filter is shown in a block diagram of FIG. 1.

Construction of the digital Nyquist filter will be described hereinbelow with reference to FIG. 1.

First, a symbol rate signal generator 1 is a circuit for generating a symbol rate signal by frequency dividing a clock signal serving as a reference of the operation of the digital Nyquist filter. The symbol rate signal denotes a signal synchronized with a symbol frequency of an input signal. Generally, when an analog/digital converter, which will be explained hereinlater, executes what is called an "oversampling" operation, a frequency of the clock signal is equal to a value that is an integer times of a symbol rate (symbol frequency). In an example of the circuit shown in FIG. 1, it is assumed that the symbol rate is set to 1 Hz, and the frequency of the clock signal is set to 3 Hz. An oversampling number M in this case is defined as follows.

$$M = \text{(clock signal frequency)}/\text{(symbol frequency)} = 3$$

An analog/digital converter (hereinafter, simply abbreviated to "ADC") 2 is a circuit for quantization converting a supplied analog signal into a digital signal comprising a predetermined number of bits such as 8 bits or 16 bits. Therefore, digital signals according to the number of bits are generated from the ADC 2. That is, circuits subsequent to an impulse generator 3 are provided for every bit of a digital conversion output from the ADC 2.

The impulse generator 3 is a circuit for converting the digital conversion output from the ADC 2 which changes at the symbol rate of the input signal, into an impulse-shaped signal which changes at the frequency of the clock signal.

A delay element 4 is a circuit for providing a delay synchronized with the sampling clock for the impulse-shaped signal. A coefficient multiplier 5 is a circuit for multiplying an output of a tap of each delay element 4 by a predetermined filtering coefficient for every tap. An adder 6 is a circuit for adding outputs from the coefficient multipliers 5 of the taps.

Subsequently, the operation of the digital Nyquist filter shown in FIG. 1 will be described hereinbelow.

First, an analog input signal is converted into a predetermined digital signal by the ADC 2. The ADC 2 executes the analog/digital converting operation by a clock signal whose sampling rate is equal to 3 Hz. However, a symbol rate signal of 1 Hz is supplied to an enable terminal which permits the output of the circuit. Therefore, the digital output from the ADC 2 changes synchronously with the symbol rate.

The digital output from the ADC 2 is subsequently supplied to the impulse generator 3, and converted into an impulse train synchronized with the clock signal of 3 Hz. A state of an input signal $S_i$ in the impulse generator 3 is shown in a time chart of FIG. 2A. A state of an output signal $X_n$ is shown in a time chart of FIG. 2B. In FIG. 2, in order to make understanding easy, each of the input and output signals is shown by amplitude values quantized to seven levels in a range from +3 to −3 including 0. Each of the actual input and output of the impulse generator 3 is a signal at a logic level obtained by encoding the amplitude value by a predetermined number of bits. The signal at the logic level here is a signal in which each of the encoded bits is expressed by "1" or "0".

Assuming that, an output of the circuit shown in FIG. 1 is set to $Y_n$, since $Y_n$ is a summation of signals which passed through the taps of the digital filter shown in the diagram, it can be expressed in a form as shown by the following equation (1).

$$Y_n = C_{1,0}X_n + C_{1,1}X_{n-1} + C_{1,2}X_{n-2} + C_{2,0}X_{n-3} + C_{2,1}X_{n-4} + C_{2,2}X_{n-5} \quad (1)$$

$$= \sum C_{1,k}X_{n-k} + C_{2,k}X_{n-k-3}$$

(where, a sum signal "$\Sigma$" in the equation expresses the summation in a range from k=0 to 2 with respect to a suffix k. It is defined that "$\Sigma$" in the mathematical expressions disclosed in the following description has a meaning similar to that mentioned above.)

In the equation (1), n denotes an integer and has a value to which +1 is added every sampling period of the clock signal. Coefficients $C_{1,0}$ to $C_{2,2}$ are filtering coefficients which have been predetermined for the coefficient multipliers 5 shown in FIG. 1, respectively.

Signals $X_i$ ($X_n$ to $X_{n-5}$) of the respective taps in the digital filter in FIG. 1 can be expressed by the following equations, as will be obviously understood from the time chart of FIG. 2B.

$$X_i = X_i (i \bmod 3 = 0), X_i = 0 (i \bmod 3 \neq 0) \quad (2)$$

where, "mod" (modulo) is an operator which is used to classify the whole integer by a remainder of a division. That is, "i mod 3" denotes that an integer i is classified into three groups by remainders 0, 1, and 2 which are obtained when the integer i is divided by 3.

That is, the equations (2) denote the following meaning. Only when the remainder which is obtained by dividing the suffix i of the signal $X_i$ by 3 is equal to 0 (for example, $X_0$, $X_3$, $X_6$, ... in FIG. 2B), $X_i = X_i$. When the remainder is equal to 1 or 2 (for example, $X_1$, $X_2$, $X_4$, ... in FIG. 2B), $X_i = 0$.

Subsequently, consideration is given to a suffix (n−k) of X in the first term of the right side in the equation (1). Since k can have only three values 0, 1, and 2, it is assumed that k=n mod 3. By substituting k =n mod 3 into the suffix (n−k) of X of the first term of the right side in the equation (1), (n−k) is expressed by the following equation (3).

$$n-k = n-(n \bmod 3) \quad (3)$$

Further, a remainder which is obtained by dividing the equation (3) by 3 becomes as follows.

$$(n-k) \bmod 3 = (n-(n \bmod 3)) \bmod 3 = 0$$

The equation is a calculation such that a value obtained by subtracting a remainder obtained by dividing n by 3 from the integer n is further divided by 3 and a resultant remainder is obtained. A result of the calculation is, therefore, equal to 0.

From those results and the conditions of the equations (2), only when k=n mod 3, $X_{n-k} = X_{n-k}$. In cases other than the case where k=n mod 3, $X_{n-k}=0$. The first term of the right side of the equation (1), therefore, can be simplified as follows.

$$\Sigma C_{1,k} X_{n-k} = C_{1,(n \bmod 3)} X_{n-(n \bmod 3)} \quad (4)$$

Now, consideration is given to the input/output signals of the impulse generator 3 in FIG. 1. As will be understood from FIG. 2A or 2B, only the input signal at the time when the output is $X_0, X_3, X_6, \ldots$ is meaningful. An output signal X in the equation (4) can be expressed as follows by using an input signal S.

$$X_{n-(n \bmod 3)} = S_j \quad (5)$$

where, J is an integer and a value which is increased by +1 every 1 symbol period.

By substituting the equation (5) into the equation (4), the first term of the right side of the equation (1) can be expressed as follows.

$$\Sigma C_{1,k} X_{n-k} = C_{1,(n \bmod 3)} S_j \quad (6)$$

Subsequently, consideration is given to a suffix (n−k−3) of X with respect to the second term of the right side of the equation (1). Also in this case, assuming that k=n mod 3 in a manner similar to the case of the first term, the suffix can be expressed as follows.

$$n-k-3 = n-(n \bmod 3)-3$$

By using a remainder which is obtained by dividing it by 3, the following equation is obtained.

$$(n-k-3) \bmod 3 = (n-(n \bmod 3)-3) \bmod 3 = 0$$

By the conditions of the equations (2), only when k=n mod 3, $$X_{n-k-3} = X_{n-k-3}$$

When k≠n mod 3, $$X_{n-k-3} = 0$$

The second term of the right side of the equation (1) can be simplified as follows in a manner similar to the first term of the right side.

$$\Sigma C_{2,k} X_{n-k-3} = C_{2,(n \bmod 3)} X_{n-(n \bmod 3)-3} \quad (7)$$

If the output signal X is expressed by the input signal S of the impulse generator 3 in FIG. 1, the following equation is obtained.

$$X_{n-(n \bmod 3)-3} = S_{j-1} \quad (8)$$

The second term of the right side of the equation (1) can be, therefore, expressed as follows by the equations (7) and (8).

$$\Sigma C_{2,k} X_{n-k-3} = C_{2,(n \bmod 3)} S_{j-1} \quad (9)$$

From those results, the equation (1) showing the output signal $Y_n$ can be simplified as follows by the equations (6) and (9).

$$Y_n = C_{1,(n \bmod 3)} S_j + C_{2,(n \bmod 3)} S_{j-1} \quad (10)$$

The output signal $Y_n$ is supplied to a digital/analog converter (not shown) as necessary, and becomes an analog signal subjected to a waveform shaping process.

In the circuit shown in FIG. 1, filtering characteristics of a desired order can be achieved by setting a value of the number N of taps of the filter (N=6 in the circuit of FIG. 1), and values of the filtering coefficients $C_{1,0}$ to $C_{2,2}$ to proper numerical values, respectively.

In the digital Nyquist filter, there is a problem that, if the filtering characteristics are complicated and are set to a high order, the number of taps increases and the scale of the circuit is substantially increased. There is also a problem that in association with an increase in circuit scale, the summation of delay times which are due to delay elements and coefficient multipliers included in the circuit increases, and an operating speed of the filter decreases.

OBJECT AND SUMMARY OF THE INVENTION

The invention is intended to overcome the above-discussed problems, and it is an object of the invention to provide a digital Nyquist filter in which a circuit scale is small and an operating speed is high.

According to the invention, there is provided a waveform shaping circuit for sampling an analog input signal and performing a waveform shaping process, comprising:

an analog/digital converting circuit for sampling the input signal on the basis of a sampling clock, thereby digitizing it; at least one delay circuit for providing a delay synchronized with a symbol rate of the input signal for an output signal of the analog/digital converting circuit; a coefficient selecting circuit for sequentially selecting one of a plurality of predetermined characteristics values synchronously with the sampling clock and setting the selected characteristics value to a predetermined coefficient; a multiplying circuit for multiplying each of an input signal and an output signal of the delay circuit by the predetermined coefficient, thereby obtaining at least two multiplication outputs; and an adding circuit for adding the multiplication outputs.

BRIEF EXPLANATION OF THE DRAWINGS

FIG. 4 is a memory constructional diagram showing the relation between addresses and stored data in a coefficient ROM circuit shown in the block diagram of FIG. 3;

DETAILED DESCRIPTION OF THE PREFERRED EMBODIMENTS

Figure 3:
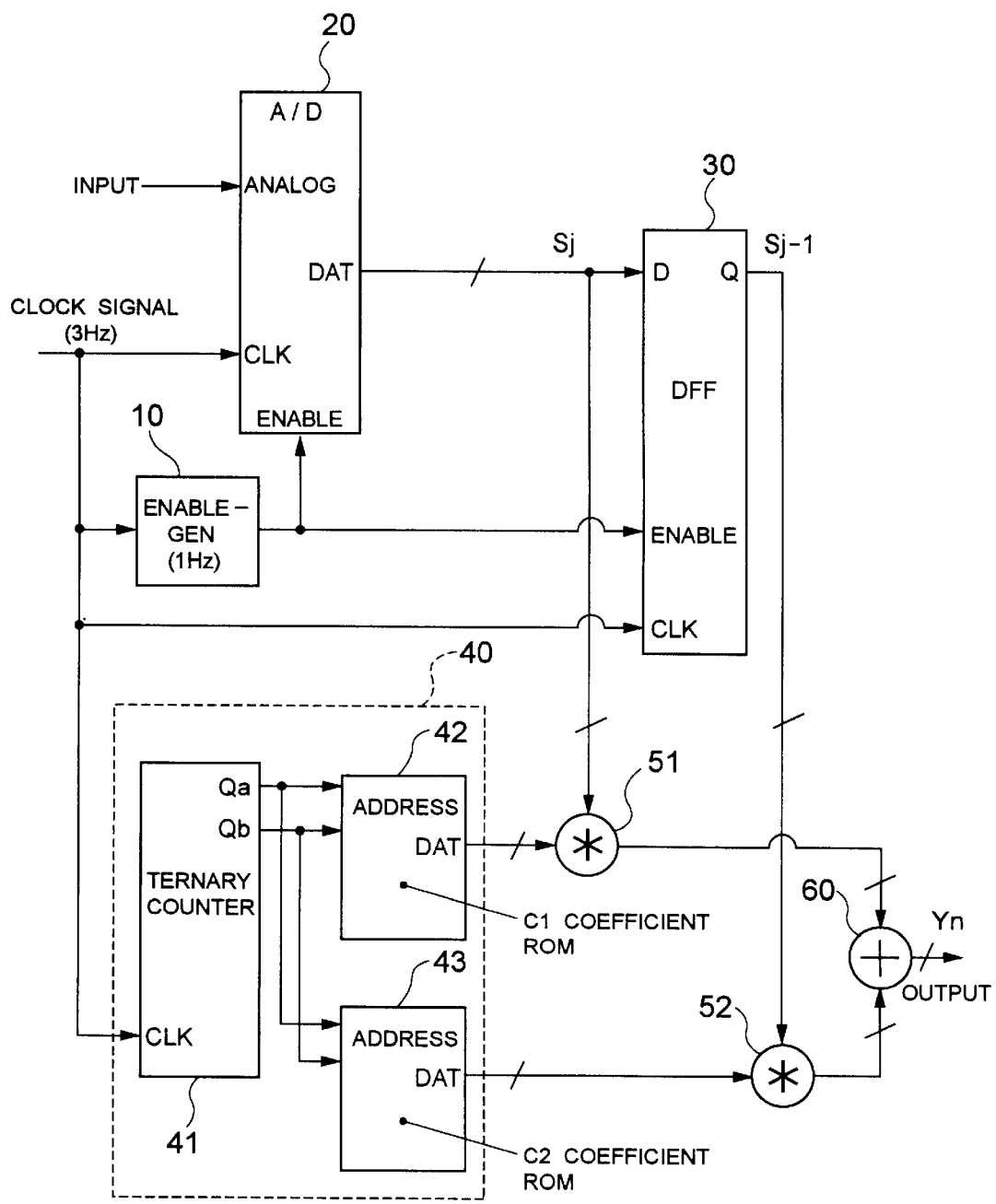
FIG. 3 is a block diagram showing the first embodiment of a digital Nyquist filter based on the invention.

The first embodiment of a digital Nyquist filter according to the invention is shown in a block diagram of FIG. 3.

First, a construction of the embodiment will be described with reference to FIG. 3. Since a symbol rate signal generator 10 and an analog/digital converter (hereinafter, simply abbreviated to "ADC") 20 are the same as those in the conventional circuit shown in FIG. 1, their description is omitted here.

A D-type flip-flop (hereinafter, simply abbreviated to "DFF") 30 latches a logic level of an input D in response to a rising or falling edge of a clock signal. The input D at this time is set to a logic level of an output Q. That is, the DFF 30 is a flip-flop for causing a delay of one clock pulse. In the embodiment, the DFF 30 is provided with an input terminal of an enable (ENABLE) signal for permitting or inhibiting output oh the DFF 30. A symbol rate signal from the symbol rate signal generator 10 is supplied to the input terminal.

As mentioned above, the ADC 20 is a circuit for sampling a supplied analog signal in accordance with the clock signal, and converting the supplied analog signal into a digital signal comprising a predetermined number of bits such as 8 bits or 16 bits. Therefore, digital signals according to the number of bits are outputted from a digital conversion output (DAT) of the ADC 20. That is, in a manner similar to the case of FIG. 1, circuits subsequent to the DFF 30 are provided for every bit of the digital conversion output from the ADC 20 except for a coefficient generating unit 40, which will be explained hereinbelow.

The coefficient generating unit 40 comprises a ternary counter 41, a C1 coefficient ROM 42, and a C2 coefficient ROM 43. The ternary counter 41 is, for example, a binary counter in which the clock signal is used as a count pulse. Count-up outputs of the counter 41 are assumed to be Qb and Qa (it is assumed that Qa is set to the LSB (Least Significant Bit)). Qa and Qb change cyclically by the ternary notation like [Qb, Qa=0, 0]→[Qb, Qa=0, 1]→[Qb, Qa=1, 0]→[Qb, Qa=0, 0]→ . . . synchronously with the clock pulses.

Each of the C1 coefficient ROM 42 and C2 coefficient ROM 43 generates data which has previously been stored in an address to a data output terminal DAT in response to an applied address signal. Contents of the data, which is stored into those ROM circuits, are the filtering coefficients mentioned above. Among the filtering coefficients, $C_{1,0}$, $C_{1,1}$, and $C_{1,2}$ have been stored in the C1 coefficient ROM 42, and $C_{2,0}$, $C_{2,1}$, and $C_{2,2}$ have been stored in the C2 coefficient ROM 43, respectively.

A relation between a memory address in each ROM circuit and each of the filtering coefficients stored in the ROM circuit is shown in FIG. 4. A memory area in the ROM circuit is not limited to the example shown in FIG. 4. When a order of a filter which is realized increases, since the number of filtering coefficients which are necessary also increases, naturally, the number of addresses in the ROM circuit and the memory area to store the data also increase.

In the embodiment, the count-up output of the ternary counter 41 is connected to the addresses of the C1 coefficient ROM 42 and C2 coefficient ROM 43, respectively. The data outputs (DATs) from ROM circuits 42 and 43 are connected to multipliers 51 and 52, respectively.

The multiplier 51 is a circuit for multiplying the output data from the C1 coefficient ROM 42 by the input signal $S_j$ to the DFF 30. The multiplier 52 is a circuit for multiplying the output data from the C2 coefficient ROM 43 by an output signal $S_{j-1}$ from the DFF 30. An adder 60 is a circuit for adding outputs of those two multipliers. Arithmetic operating processes of the multiplication and addition are executed every bit constructing $S_j$ and $S_{j-1}$ as digital data.

In the embodiment shown in FIG. 3, a clock signal of a frequency of 3 Hz is used as a sampling clock serving as a reference of the operation of the filter. A frequency of 1 Hz is used as a symbol rate of the input signal. Also in the embodiment, therefore, the oversampling number M is obtained as follows.

$$M=\text{(clock signal frequency)/(symbol frequency)}=3$$

Figure 1:
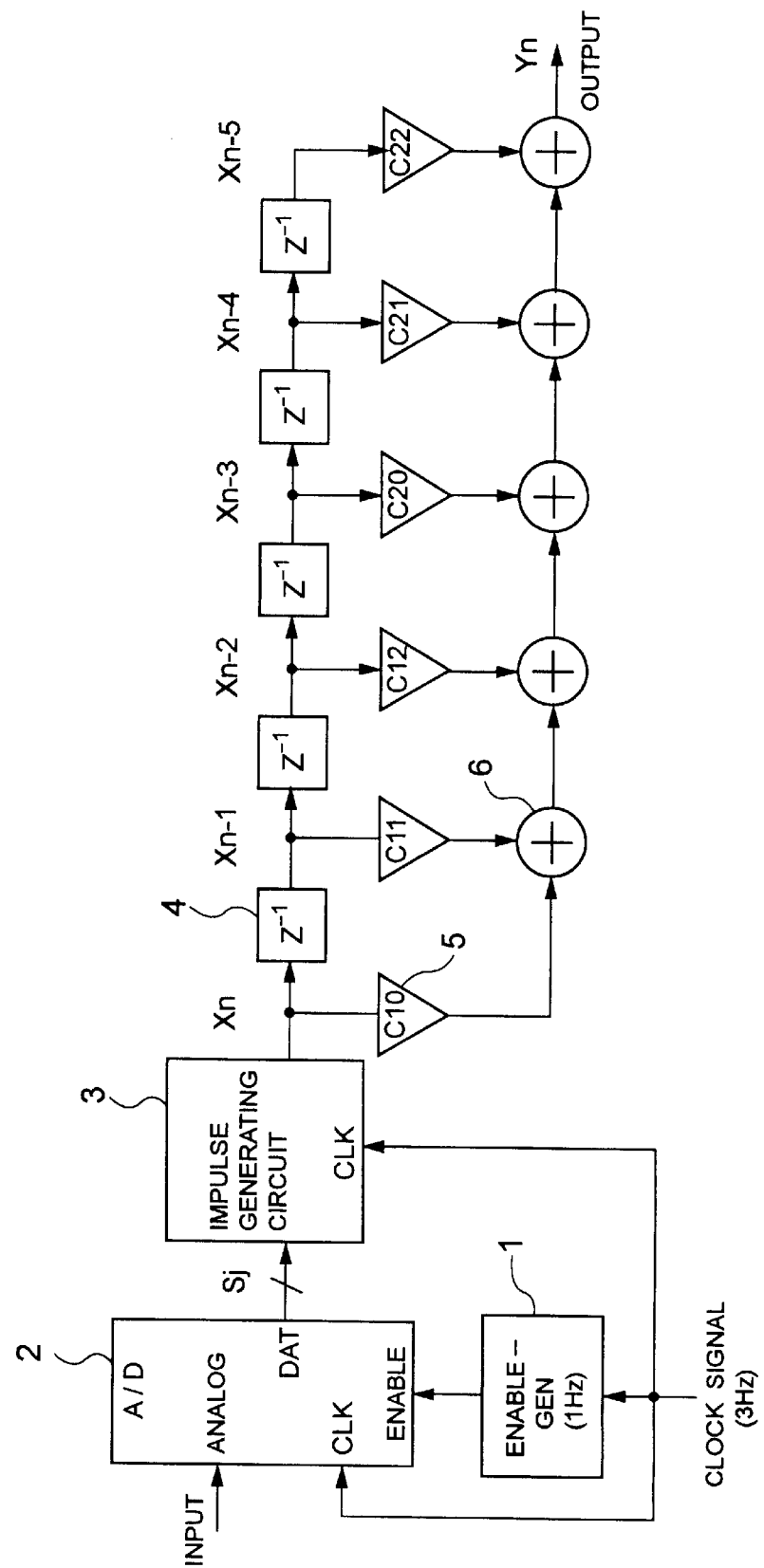
FIG. 1 is a block diagram showing a construction of a conventional digital Nyquist filter.
Figure 2A:
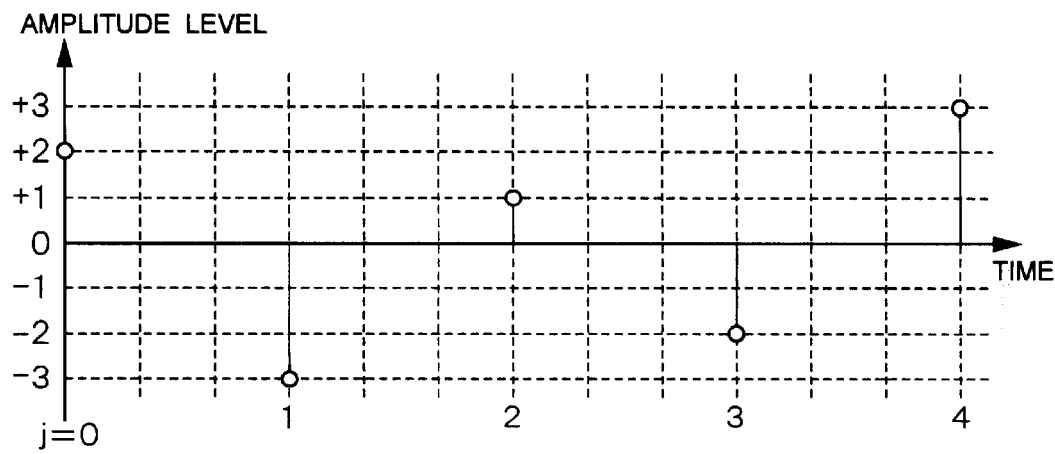
FIGS. 2A and 2B are time charts showing input and output signals in an impulse generator in a circuit of FIG. 1.
Figure 2B:
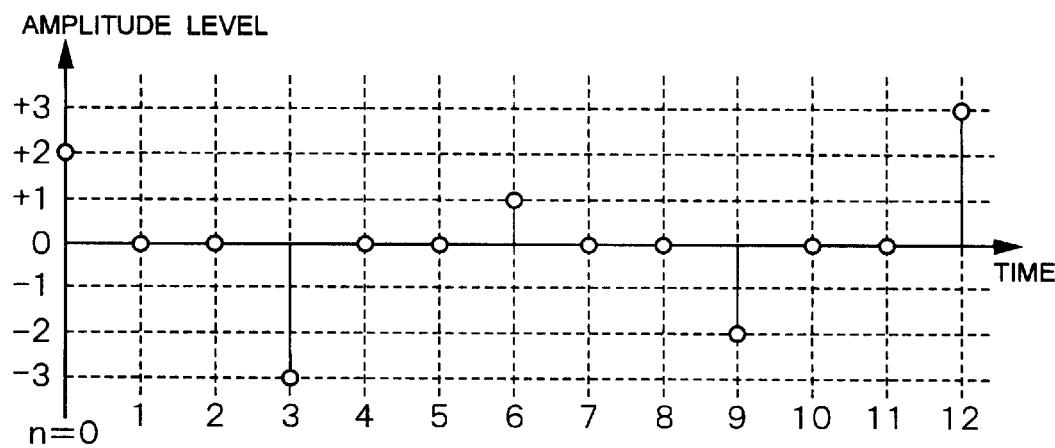

Further, it is assumed that filtering characteristics serving as a base of the filter circuit shown in FIG. 3 are also the same as the filtering characteristics of the filter circuit shown in FIG. 1. In a construction of a digital Nyquist filter which can be achieved by the embodiment, therefore, the number of taps is equal to N=6. It is also assumed that filtering coefficients at the respective taps have six values $C_{1,0}$ to $C_{2,2}$ as values similar to the values in the case of FIG. 1.

The construction of the embodiment is not limited to the number of taps and the values of the filtering coefficients. That by design is, it is assumed that the number of taps and the values of the filtering coefficients may be changed, and can have various values in order to achieve desired filtering characteristics.

The operation of the embodiment shown in the block diagram of FIG. 3 will be described hereinbelow.

First, the analog input signal is converted into a digital signal of a predetermined number of bits by the ADC 20. The ADC 20 executes the analog/digital converting operation synchronously with a clock signal having a sampling rate equal to 3 Hz. However, a symbol rate signal from the symbol rate signal generator 10 is supplied to an enable terminal which permits the output of the circuit. The digital output from the ADC 20, therefore, changes synchronously with the symbol rate (1 Hz).

The digital output from the ADC 20 is supplied to the DFF 30. The DFF 30 is a flip-flop of a D type for latching the input D by the clock signal and generating output Q. In the circuit of FIG. 3, an output of the DFF 30 is inhibited or permitted by the symbol rate signal from the symbol rate signal generator 10. The logic level of the input D is, therefore, set into an output Q of the DFF 30 every period of the symbol rate signal. One period of the symbol rate signal corresponds to three periods of the clock signal serving as a sampling pulse as shown by the oversampling number M (M=3). That is, assuming that the input signal of the DFF 30 is set to $S_j$, then the output signal of the DFF 30 becomes the input signal $S_{j-1}$ of one prior symbol period.

The clock signal (3 Hz) is supplied also to the coefficient generating unit 40, and supplied as a count clock to the ternary counter 41 in the coefficient generating unit 40. Qa and Qb as count-up outputs of the ternary counter 41 are connected to the memory addresses of the C1 coefficient ROM 42 and C2 coefficient ROM 43. The memory addresses of the ROM circuits 42 and 43, therefore, change cyclically in accordance with the count-up of the ternary counter 41. The output data from the C1 coefficient ROM 42 and C2 coefficient ROM 43, that is, the filtering coefficients shown in FIG. 4 also change cyclically in accordance with the change in memory addresses.

The output data from the C1 coefficient ROM 42 and C2 coefficient ROM 43 are multiplied with the input signal $S_j$ or the output signal $S_{j-1}$ of the DFF 30 in the multiplier 51 or 52, respectively. After that, the two multiplication results are subjected to an adding process every corresponding bit in the adder 60, and become the output signal $Y_n$.

Figure 5:
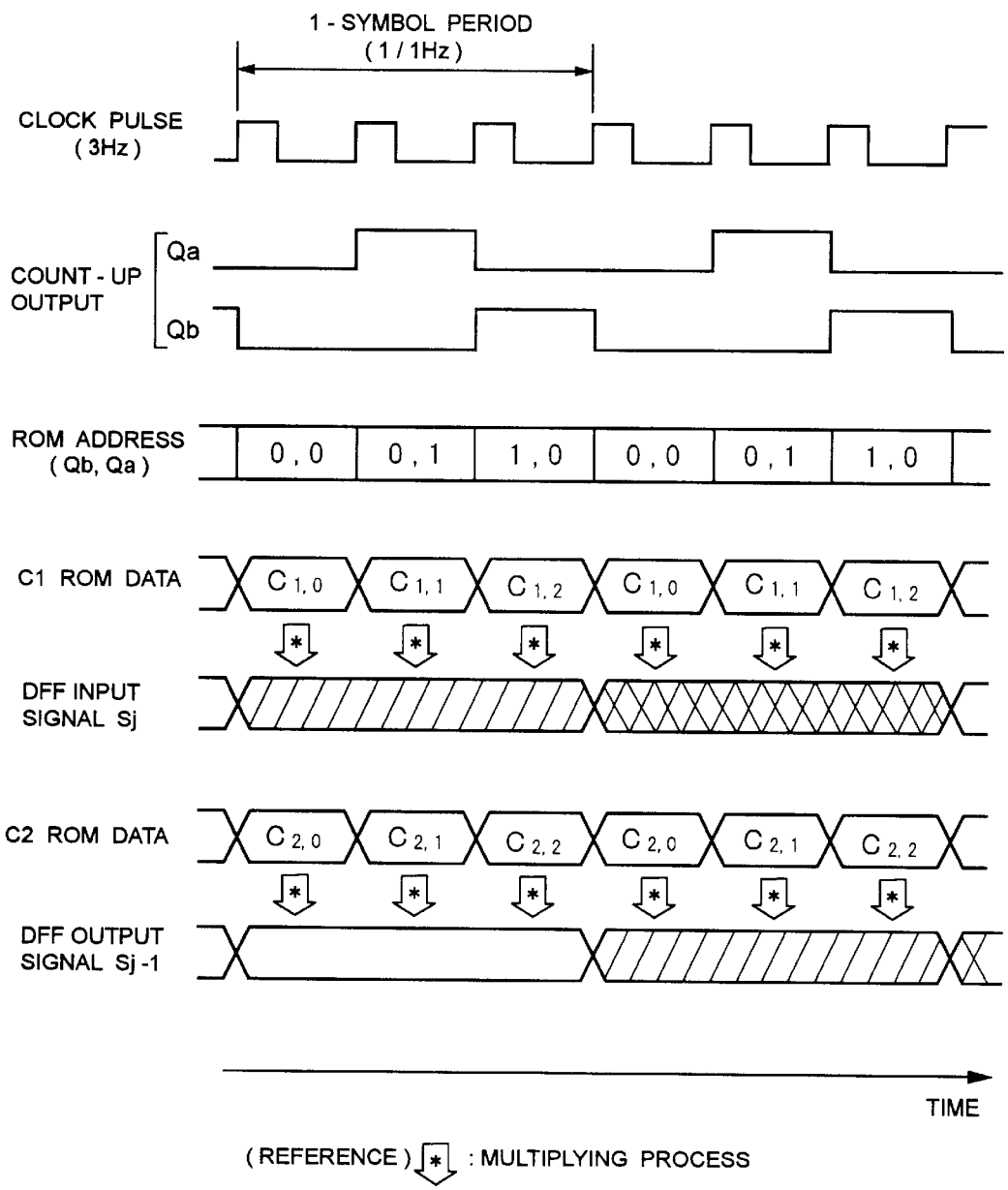
FIG. 5 is a time chart showing the operations of portions around a coefficient generating unit shown in the block diagram of FIG. 3.

The count-up operation of the ternary counter 41 described above, the changes in memory addresses in the two ROM circuits and output data, and the relation between the input signal $S_j$ and the output signal $S_{j-1}$ of the DFF 30 are shown in a time chart of FIG. 5.

The output signal $Y_n$ generated by above mentioned processes is supplied to a digital/analog converter (not shown) as necessary, and reproduced as an analog signal subjected to a waveform shaping process.

Finally, a point that the output signal $Y_n$ of the circuit shown in FIG. 3 is equal to the output of the digital Nyquist filter according to the conventional circuit shown in FIG. 1 will be proved.

First, an output of the multiplier 51 is assumed to be A. A denotes a multiplication result of the input signal $S_j$ to the DFF 30 and the filtering coefficients $C_{1,0}$, $C_{1,1}$, and $C_{1,2}$ as output data from the C1 coefficient ROM 42. A can be, consequently, expressed by the following equation.

$$A = C_{1,(n \bmod 3)} S_j \qquad (11)$$

Similarly, an output of the multiplier 52 is assumed to be B. B denotes a multiplication result of the output signal $S_{j-1}$ from the DFF 30 and the output data $C_{2,0}$, $C_{2,1}$, and $C_{2,2}$ from the C2 coefficient ROM 43. B can be, consequently, expressed by the following equation.

$$B = C_{2,(n \bmod 3)} S_{j-1} \qquad (12)$$

The output $Y_n$ of the circuit shown in FIG. 3 is obtained by adding the outputs of the multipliers 51 and 52 by the adder 60. $Y_n$, therefore, can be expressed as follows.

$$Y_n = A + B \qquad (13)$$

When the equations (11) to (13) shown above are collected, the output $Y_n$ of the circuit shown in FIG. 3 is as follows.

$$Y_n = C_{1,(n \bmod 3)} S_j + C_{2,(n \bmod 3)} S_{j-1} \qquad (14)$$

The equation (14) is equivalent to the output $Y_n$ of the conventional digital Nyquist filter shown in the equation (10) mentioned above. Consequently, it is proved that the circuit according to the embodiment shown in FIG. 3 shows the same operation as that of the conventional digital Nyquist filter shown in FIG. 1.

As described above, according to the embodiment, in the digital Nyquist filter which previously required N taps, the number of taps can be reduced to N/M (M is the oversampling number). Even in case of constructing a digital Nyquist filter of a high order, a circuit scale of the filter can be miniaturized. The processing speed is also improved owing to the reduction of the number of elements constructing the circuit.

Figure 6:
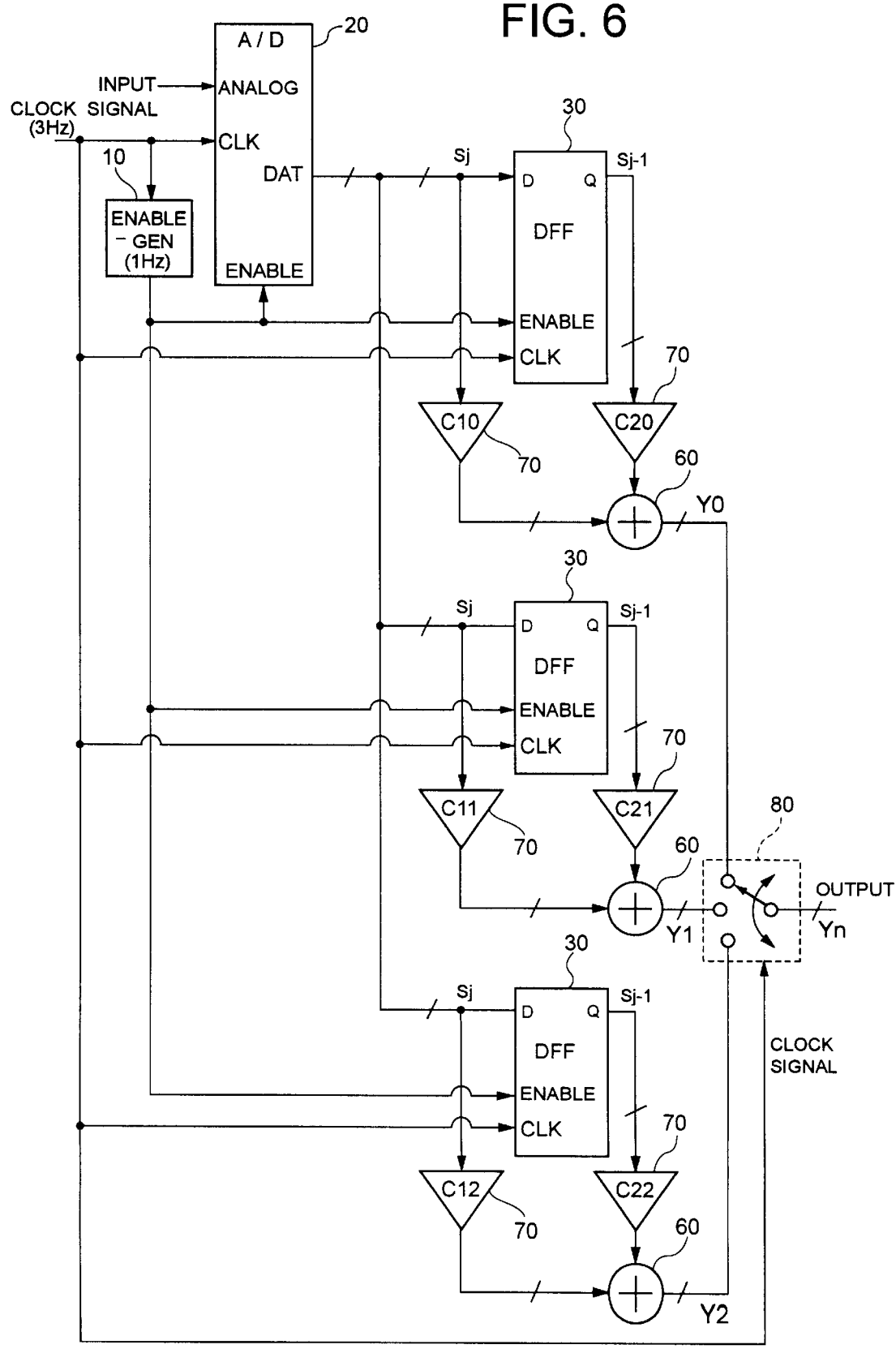
FIG. 6 is a block diagram showing the second embodiment of a digital Nyquist filter based on the invention.

The second embodiment of a digital Nyquist filter based on the invention is now shown in a block diagram of FIG. 6.

Also in the second embodiment, the clock signal of the frequency of 3 Hz is used as a sampling clock serving as a reference of the operation of the filter. The frequency of 1 Hz is used as a symbol rate of the input signal. Further, it is assumed that filtering characteristics serving as a base of the filter circuit are the same as the filtering characteristics of the filter circuit mentioned above. In a construction of the digital Nyquist filter which can be achieved by the embodiment, therefore, the number of taps is equal to N=6. It is also assumed that filtering coefficients at the respective taps have six values $C_{1,0}$ to $C_{2,2}$ as values similar to the values in the cases of FIGS. 1 and 3. The number of taps and the values of filtering coefficients may be changed by design, and the embodiment is not limited to the above-mentioned values.

The construction of the second embodiment will be described with reference to FIG. 6. First, the circuit of FIG. 6 comprises: the symbol rate signal generator 10; the analog/digital converter 20; the D-type flip-flops 30; the adders 60; coefficient multipliers 70; and an output scanner 80. In the construction, the symbol rate signal generator 10, ADC 20, DFF 30, and adder 60 are the same as the component elements in the first embodiment shown in FIG. 3. An explanation regarding the above-identified component elements is, therefore, omitted here.

The coefficient multiplier 70 is a circuit for multiplying the signal on each of the input side and the output side of the DFF 30 by predetermined filtering coefficients. In each coefficient multiplier 70 shown in FIG. 6, the filtering coefficients $C_{1,0}$ and $C_{2,0}$ have been set into a pair of coefficient multipliers at the upper stage, the filtering coefficients $C_{1,1}$ and $C_{2,1}$ have been set into a pair of coefficient multipliers at the middle stage, and the filtering coefficients $C_{1,2}$ and $C_{2,2}$ have been set into a pair of coefficient multipliers at the lower stage, respectively.

The output scanner 80 is a circuit for sequentially repetitively scanning outputs from the adders 60 in FIG. 6 synchronously with the clock signal (3 Hz).

A circuit group comprising the DFF 30, coefficient multiplier 70, and adder 60 shown at each of the upper, middle, and lower stages and the output scanner 80 are provided for each bit of the digital conversion output signal from the ADC 20.

Subsequently, the operation of the circuit shown in FIG. 6 will be described hereinbelow.

In the embodiment, the input analog signal is converted into a predetermined digital value by the ADC 20. Further, a delay synchronized with the symbol rate is applied to the digital signal by the DFF 30. The above point is similar to that in the case of the first embodiment shown in FIG. 3. In the case of the second embodiment, however, the digital conversion output from the ADC 20 is supplied simultaneously to the three circuit groups at the upper, middle, and lower stages shown in FIG. 6. A delay corresponding to one symbol period is added by the DFF 30 included in each circuit group.

In the three circuit groups, the multiplying processes of the filtering coefficients $C_{1,0}$ to $C_{1,2}$ and $C_{2,0}$ to $C_{2,2}$ are executed by the coefficient multiplier 70 to the input signal $S_j$ and the output signal $S_{j-1}$ of each DFF 30, respectively. Outputs of a pair of coefficient multipliers 70 are added by the adder 60 included in each circuit group. Addition results $Y_0$ to $Y_2$ are collected as an output signal from each circuit group to the output scanner 80.

The output scanner 80 sequentially scans the output signals $Y_0$ to $Y_2$ from the circuit groups at a speed synchronized with the clock signal. The output scanner 80 generates a scan output as an output signal $Y_n$ of the filter circuit. That is, the output signals from the circuit groups repetitively appear as $Y_0 \rightarrow Y_1 \rightarrow Y_2 \rightarrow Y_0 \rightarrow \ldots$ in the output of the circuit shown in FIG. 6 synchronously with the clock signal.

The output signal $Y_n$ formed by the above-mentioned processes is supplied to a digital/analog converter (not shown) as necessary, and becomes an analog signal subjected to a waveform shaping process.

Finally, the point that the output signal $Y_n$ is equal to the output of the conventional filter circuit even in the second embodiment will be proved.

The output signal $Y_n$ of the filter circuit shown in FIG. 6 is obtained by sequentially repetitively switching the outputs $Y_0$, $Y_1$, and $Y_2$ of the adders 60 synchronously with the clock signal. $Y_n$ can, therefore, be expressed as follows.

$$Y_n = Y_{(n \bmod 3)} \qquad (15)$$

The output signals $Y_{(n \bmod 3)}$ of the adders 60 are obtained by adding the resultant signals obtained by multiplying the input signal $S_j$ of the DFF 30 by the filtering coefficients $C_{1,0}$, $C_{1,1}$, and $C_{1,2}$ and the resultant signals obtained by multiplying the output signal $S_{j-1}$ of the DFF 30 by the filtering coefficients $C_{2,0}$, $C_{2,1}$, and $C_{2,2}$. $Y_{(n \bmod 3)}$ can be, therefore, expressed as follows.

$$Y_{(n \bmod 3)} C_{1,(n \bmod 3)} S_j + C_{2,(n \bmod 3)} S_{j-1} \quad (16)$$

The output signal $Y_n$ is as follows by the equations (15) and (16).

$$Y_n C_{1,(n \bmod 3)} S_j + C_{2,(n \bmod 3)} S_{j-1} \quad (17)$$

The equation (17) is equal to the output signal $Y_n$ of the conventional digital Nyquist filter shown in the equation (10).

As described above, according to the embodiment, the output scanner 80 scans the output from the adder 60 included in each circuit group synchronously with the sampling clock. It is, therefore, sufficient that a processing speed of each adder 60 is equal to 1/M (M: oversampling number) of the sampling rate, that is, the symbol rate of the input signal. In the first embodiment shown in FIG. 3, since the filtering coefficients are sequentially updated synchronously with the sampling clock from the ROM circuit, the adder has to operate at the sampling rate.

Assuming that, therefore, a maximum operation sampling rate in the first embodiment is set to Fmax. In case of constructing the digital filter of the second embodiment by using an adder of the same processing speed as Fmax, a maximum operation sampling rate in the second embodiment is equal to Fmax×M. That is, according to the second embodiment, an operating speed of the digital filter can be increased M times.

As described in detail above, according to the first embodiment of the invention, the number of taps constructing the digital Nyquist filter can be reduced, the miniaturization and power saving of the circuit can be achieved, and the processing speed can be improved. According to the second embodiment of the invention, even in case of using the circuit elements of the same speed as the conventional circuit, the processing speed of the digital Nyquist filter can be improved.

It is understood that the foregoing description and accompanying drawings set forth the preferred embodiments of the invention at the present time. Various modification, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent Application No. 2001-308869 which is hereby incorporated by reference.

What is claimed is:

1. A waveform shaping circuit for sampling an analog input signal and performing a waveform process, comprising:

an analog/digital converting circuit for sampling said analog input signal on the basis of a sampling clock, thereby digitizing said analog input signal;

at least one delay circuit for providing a delay synchronized with a symbol rate of said analog input signal for an output signal of said analog/digital converting circuit;

a coefficient determining circuit for sequentially selecting one of a plurality of predetermined characteristics values synchronously with said sampling clock and determining a selected characteristics value as a multiplicative coefficient;

a multiplying circuit for multiplying each of an input signal and an output signal of said delay circuit by said multiplicative coefficient, thereby obtaining at least two multiplication outputs; and an adding circuit for adding said multiplication outputs.

2. A circuit according to claim 1, wherein said coefficient determining circuit includes a counter circuit for counting said sampling clocks and at least one storing circuit in which said plurality of characteristics values have been stored in predetermined addresses, and the address in said storing circuit is designated in accordance with a count output from said counter circuit, and the characteristics value stored in said address is said predetermined coefficient.

3. A waveform shaping circuit for sampling an analog input signal by an oversampling value M so as to produce a digital signal, and performing a process for said digital signal thereby to produce a processed digital signal, comprising:

an analog/digital converting circuit for sampling said analog input signal in synchronism with a sampling clock signal having a clock frequency M times as high as the symbol rate of said analog input signal, so as to successively produce sample data;

an M number of waveform processing circuits each including at least one delay circuit for providing a delay synchronized with a symbol rate of said analog input signal for said sample data, a coefficient multiplying circuit for multiplying the respective ones of said sample data and the delayed sample data by respective a predetermined coefficients, thereby obtaining respective multiplication outputs, and an adding circuit for adding said multiplication outputs; and an output selecting circuit for selecting one of outputs of said M waveform processing circuits in synchronism with said sampling clock so as to form said processed digital signal.

\* \* \* \* \*